United States Patent
Takahashi

(10) Patent No.: US 7,844,941 B2
(45) Date of Patent: Nov. 30, 2010

(54) CHARGED PARTICLE BEAM EXPOSURE METHOD AND CHARGED PARTICLE BEAM EXPOSURE DEVICE

(75) Inventor: Yasushi Takahashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/508,642

(22) Filed: Jul. 24, 2009

(65) Prior Publication Data

US 2009/0288060 A1 Nov. 19, 2009

Related U.S. Application Data

(62) Division of application No. 11/104,444, filed on Apr. 13, 2005, now Pat. No. 7,582,884.

(30) Foreign Application Priority Data

Jul. 21, 2004 (JP) ............................... 2004-212517

(51) Int. Cl.
*G06F 17/50* (2006.01)
*G21K 5/10* (2006.01)
*H01J 37/08* (2006.01)
*H01L 21/027* (2006.01)

(52) U.S. Cl. ...................... 716/21; 716/19; 250/492.23; 250/492.2; 250/492.3; 250/492.22; 250/492.1; 438/16; 430/5; 430/296; 430/311; 257/E21.53

(58) Field of Classification Search ....................... None
See application file for complete search history.

(56) References Cited

U.S. PATENT DOCUMENTS 6,415,432 B1 7/2002 Saito et al.
6,541,783 B1 4/2003 Robinson et al.
6,901,576 B2 * 5/2005 Liebmann et al. ............. 716/19

FOREIGN PATENT DOCUMENTS

| JP | 2000323377 A | * | 11/2000 |
| JP | 2001052999 A | * | 2/2001 |
| JP | 2001168006 A | * | 6/2001 |
| JP | 2004200275 A | * | 7/2004 |

* cited by examiner

*Primary Examiner*—Leigh Marie Garbowski
(74) *Attorney, Agent, or Firm*—Westerman, Hattori, Daniels & Adrian, LLP

(57) ABSTRACT

When a space, sandwiched by large patterns having a predetermined size or more, is exposed using a charged particle beam, the space sandwiched by the large patterns is exposed using a common block mask having the space and edge portions of the large patterns on both sides of the space, and portions other than the edge portions of the large patterns on both sides are exposed by a variable rectangular beam or by using another block mask.

7 Claims, 9 Drawing Sheets

PROGRAM TO BE SOLOVED
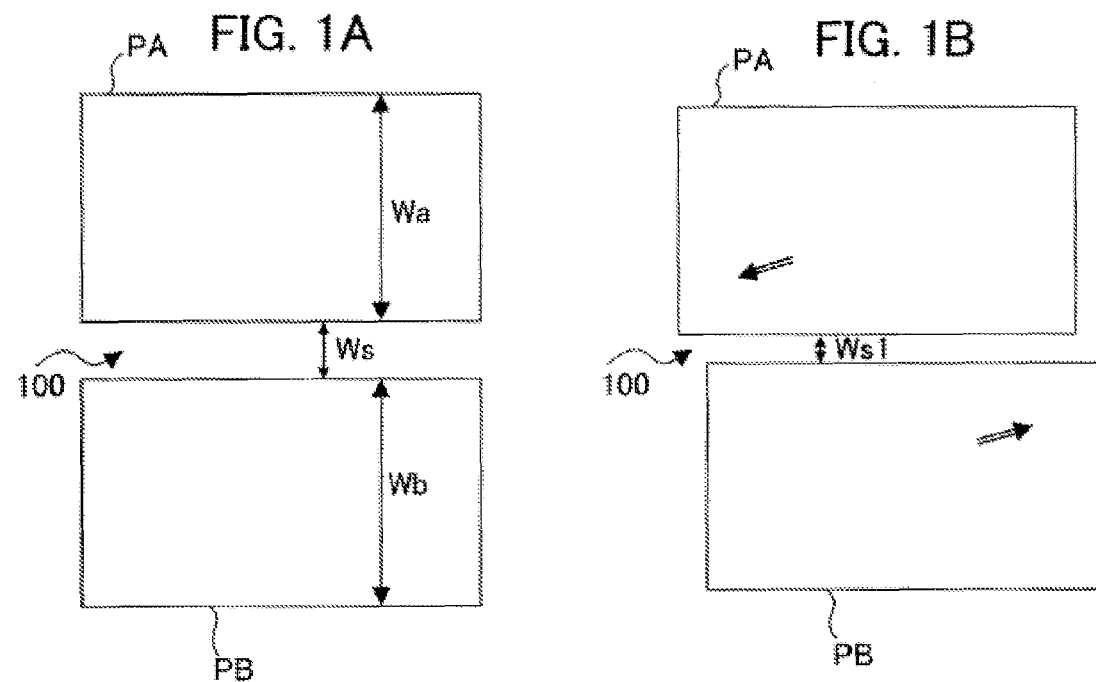
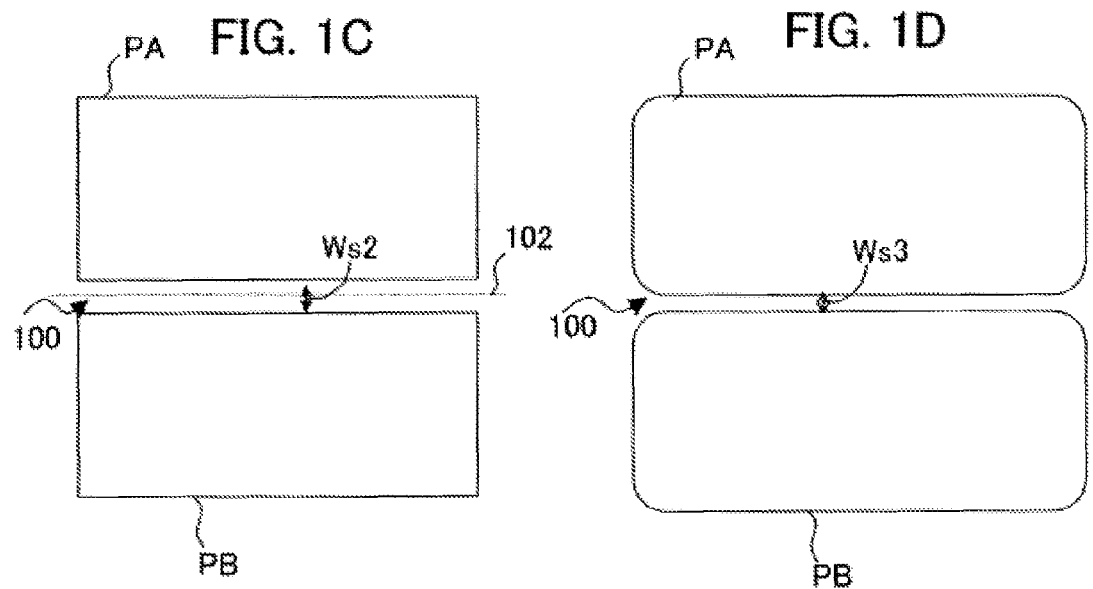

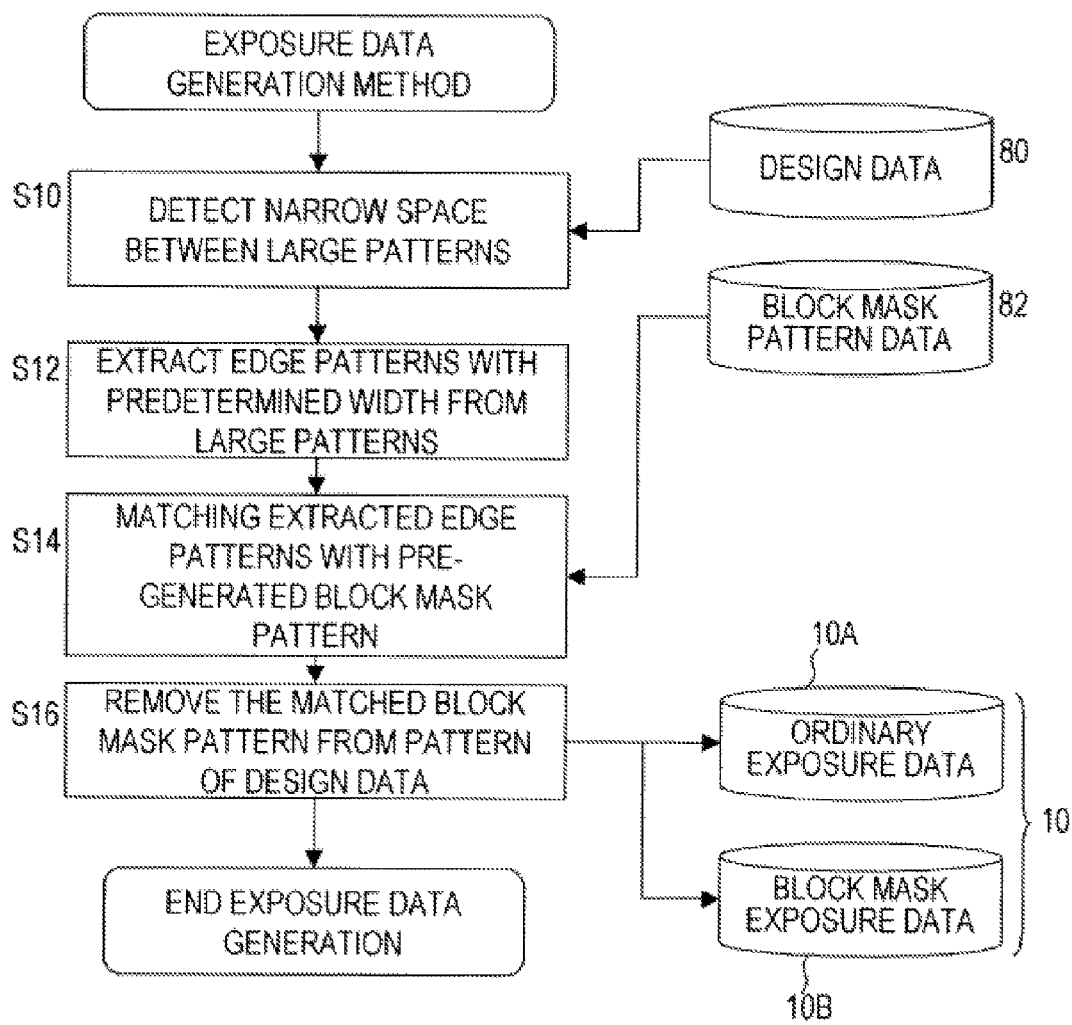

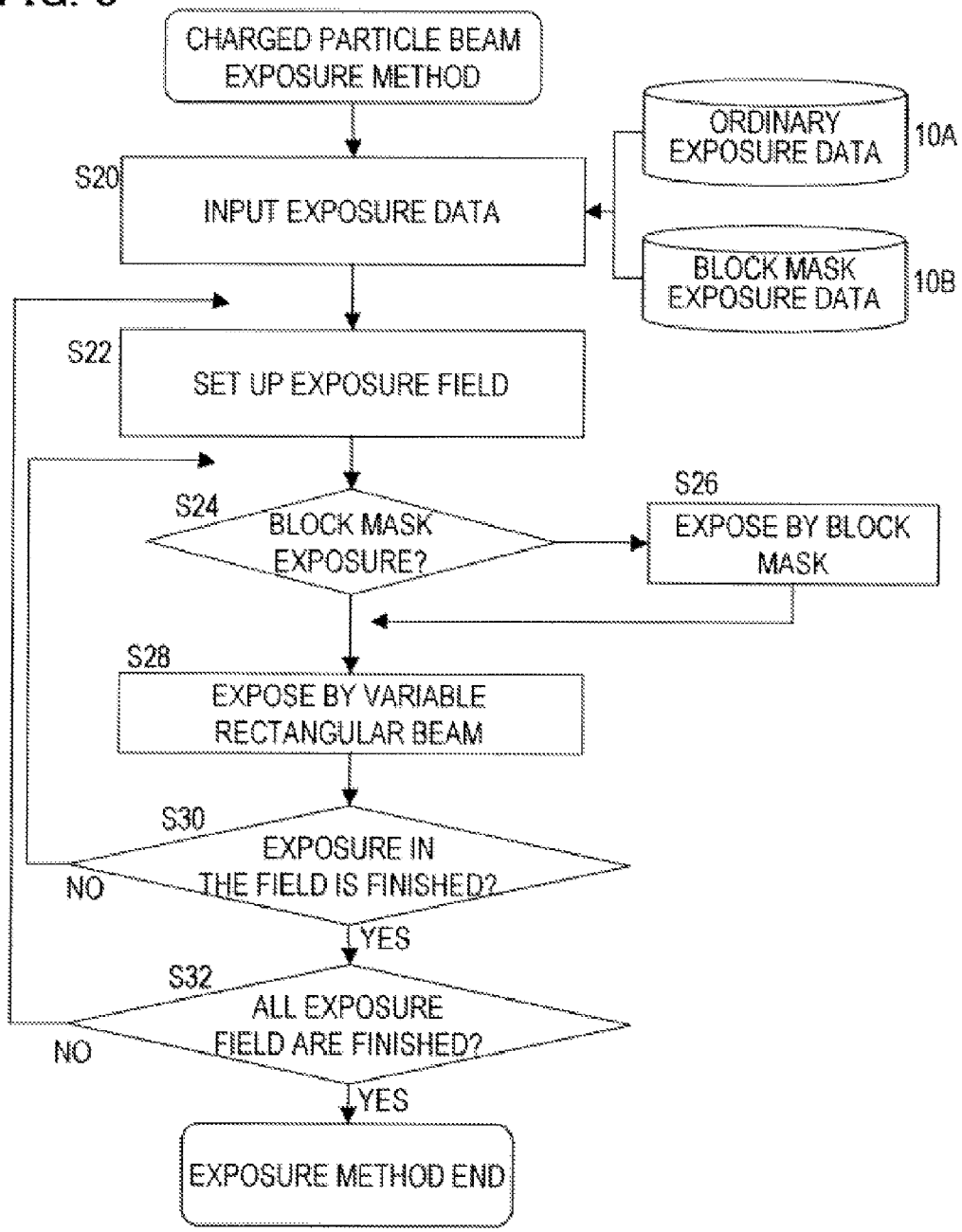

FIG. 9
| SPACE WIDTH \ PATTERN SIZE | 1.0 μm | 0.5 μm | 0.2 μm |
|---|---|---|---|
| 0.1 μm | 0.15 μm<br>B3(W3) | 0.12 μm<br>B2(W2) | 0.10 μm<br>B1(W1) |
| 0.5 μm | 0.50 μm | 0.50 μm | 0.50 μm |
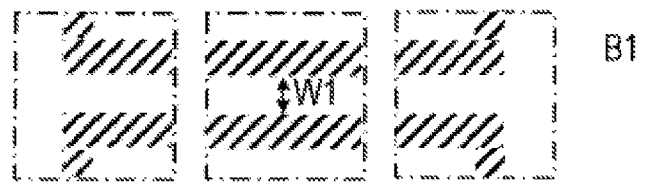
B1
B2
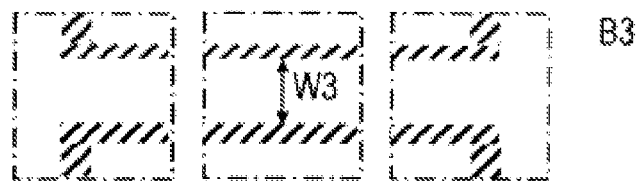
B3

CHARGED PARTICLE BEAM EXPOSURE METHOD AND CHARGED PARTICLE BEAM EXPOSURE DEVICE

CROSS-REFERENCE TO RELATED APPLICATIONS

This application is a divisional of application Ser. No. 11/104,444 filed Apr. 13, 2005, the entire contents of which are incorporated herein by reference, which is based upon and claims the benefit of priority from the prior Japanese Patent Application No. 2004-212517, filed on Jul. 21, 2004, the entire contents of which are incorporated herein by reference.

BACKGROUND OF THE INVENTION

1. Field of the Invention

The present invention relates to a charged particle beam exposure method and exposure device thereof, and more particularly to a charged particle beam exposure method for exposing a narrow space between large sized patterns at high precision, and the exposure device thereof.

2. Description of the Related Art

An exposure method using a charged particle beam, such as an electron beam, enables forming micro-patterns by directly writing them on a wafer. In this writing method, a variable rectangular beam formed by allowing electron beams to pass through two rectangular openings is deflected and irradiated at the drawing position on the wafer, so that the pattern is drawn, or the electron beam is passed through a block mask corresponding to a predetermined repeat pattern, and is deflected and irradiated at the drawing position on the wafer, so that the pattern is drawn. The block mask normally corresponds to the repeat pattern, and is used for drawing a repeat pattern comprised of lines and spaces, for example. A block mask is disclosed, for example, in Japanese Patent Application Laid-Open No. H4-100208.

In the electron beam exposure method, a problem with the displacement of development patterns caused by a proximity effect has been noted. Particularly due to the influence of forward scattering and backward scattering on the resist layer when an electron beam is irradiated, the pattern width increases in an area where the pattern density is high, and the pattern width decreases in isolated patterns where the pattern density is low. In order to suppress the influence of the proximity effect, a correction of the exposure pattern, a correction of the exposure dosage and an addition of an auxiliary exposure have been proposed. For example, these proposals are disclosed in Japanese Patent Application Laid-Open No. 2001-52999 and in No. 2000-323377.

SUMMARY OF THE INVENTION

In the charged particle beam exposure method, a problem is that the exposure margin for a narrow space sandwiched between large sized patterns becomes narrower as the patterns become finer. In a narrow space sandwiched between large patterns, the pattern density of the surroundings is high, and the stored exposure energy by backward scattering is high, therefore the margin of the pattern accuracy, with respect to the effective exposure dosage dispersion due to the dispersion of exposure dosage and dispersion of resist film thickness, is narrow, which makes it difficult to form a narrow space at high precision. Also if the boundary of the exposure fields coincides with such a narrow space area, the accuracy margin of the narrow space area becomes even smaller, because the influence of the alignment accuracy between the fields is added. If the influence of out-of-focus of the beam and beam blurring due to the Coulomb interaction of a large sized rectangular beam are also added, the accuracy margin of the narrow space area further decreases.

With the foregoing view, it is an object of the present invention to provide a charged particle beam exposure method for increasing the exposure accuracy of a narrow space sandwiched by large patterns, an exposure device thereof, and exposure data generation method thereof.

To achieve the above object, according to the first aspect of the present invention, when a space, sandwiched by large patterns having a predetermined size or more, is exposed using a charged particle beam, the space sandwiched by the large patterns is exposed using a common block mask having the space and edge portions of the large patterns on both sides of the space, and portions other than the edge portions of the large patterns on both sides are exposed by a variable rectangular beam or by using another block mask.

In the first aspect, it is preferable that the common block mask has a pattern corresponding to the edge portions on both sides and the space portion there between. Also it is preferable that the pattern width of the space portion of the common block mask has a different size according to the pattern size of the large patterns on both sides.

To achieve the above objects, the second aspect of the present invention is an exposure data generation method for generating exposure data from design data including a plurality of patterns, comprising steps of detecting a narrow space area sandwiched between a pair of large patterns having a predetermined size or more among the plurality of patterns, extracting edge patterns having a predetermined width from the pair of large patterns sandwiching the detected narrow space, and generating first exposure data for exposing the narrow space area using a first block mask having the narrow space and the edge patterns on both sides thereof, and second exposure data for exposing the pair of large patterns other than the narrow space area using a second block mask that is different from the first block mask, or a mask for a variable rectangular beam.

According to the above aspect of the invention, a space sandwiched by large sized patterns is exposed by a common block mask having the edge portions of the large patterns on both sides and the space, so the influence of the alignment accuracy between the fields, and the influence of out of focus of the beam and the beam blurring can be eliminated, and the accuracy of the size of the narrow space sandwiched by large patterns can be increased.

BRIEF DESCRIPTION OF THE DRAWINGS

FIG. 1 are diagrams depicting the problems to be solved by the present invention;

FIG. 6 is a flow chart depicting the exposure data generation method according to the present embodiment;

FIG. 8 is a flow chart depicting the electron beam exposure method according to the present embodiment; and FIG. 9 are diagrams depicting the correction of the block masks according to the present embodiment.

DESCRIPTION OF THE PREFERRED EMBODIMENTS

Figure 2A:
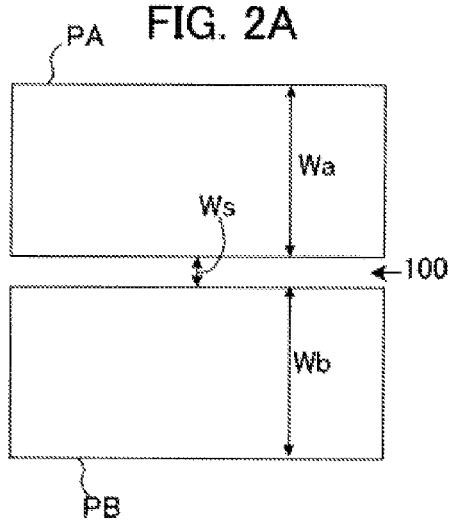
FIG. 2 are diagrams depicting an outline of the electron beam exposure according to the present invention.
Figure 2B:
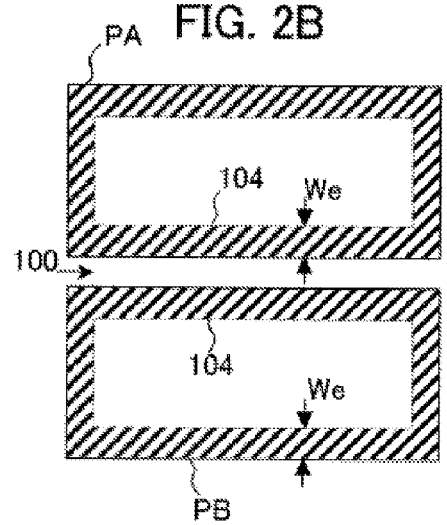

Embodiments of the present invention will now be described with reference to the drawings. The technical scope of the present invention, however, is not limited to these embodiments, but extends to the matters stated in the Claims and equivalents thereof. The present invention can be applied to charged particle beam exposure, but in the following description, electron beam exposure, an example thereof, will be used for explanation.

FIG. 1 are diagrams depicting the problem to be solved by the present invention. FIG. 1A shows a narrow space 100 sandwiched by large patterns PA and PB which sizes are larger than a predetermined size. The pattern widths Wa and Wb of the large pattern PA and large pattern PB are wider than a predetermined reference size. In this case, the pattern area density around the narrow space 100 is high, where the influence of backward scattering is high, and it is known that the space width Ws tends to disperse due to the dispersion of exposure dosage and dispersion of resist film thickness, and therefore the margin for the space width is narrow or small. In the case of the narrow space 100, which can have only a narrow margin because of the proximity effect in this way, the space width Ws1 of the narrow space 100 may become smaller due to the displacement of the large patterns PA and PB (shift in the arrow directions), as shown in FIG. 1B. Also as FIG. 1C shows, if the boundary 102 of the exposure field happens to be positioned in the space 100 between the large patterns PA and PB, the large patterns PA and PB are displaced due to the alignment accuracy between different exposure fields, and the space width Ws2 may become smaller, just like the case of FIG. 1B. Also as FIG. 1D shows, if the large patterns PA and PB are written by a variable rectangular beam respectively, patterns may become blurred because of out of focus, or by the Coulomb interaction caused by a large variable rectangular beam.

In this way, in the narrow space 100 sandwiched by large patterns, of which sizes are larger than a predetermined size, the process margin to acquire a high precision space width will be very narrow if the patterns are written and exposed by the electron beam exposure method, and in the worst case, the large patterns are shorted, and the narrow space cannot be formed.

FIG. 2 are diagrams depicting an outline of electron beam exposure according to the present embodiment. FIG. 2A shows an exposure pattern having the narrow space 100 sandwiched by the large patterns PA and PB, of which sizes are larger than a predetermined size, just like the case of FIG. 1A. For this exposure pattern, each large pattern PA and PB are not drawn by the variable rectangular beam or by using a beam of a certain block mask, but is drawn by a beam using a common block mask including the edge portions of the patterns PA and PB and the space 100 there between. As FIG. 2B shows, the edge pattern 104 with a predetermined width We is generated for both large patterns PA and PB by a predetermined pattern processing. This edge width We is preferably the same as the minimum pattern width in the LSI design, or half of the minimum pattern width, or the width Ws of the space 100.

Figure 2C:
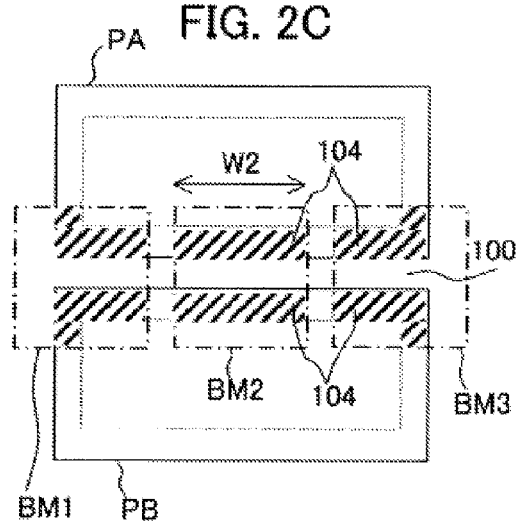
Figure 2D:
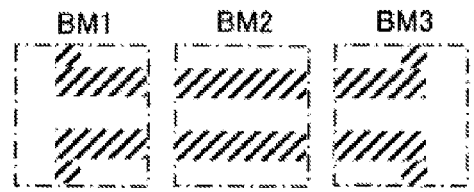

And as FIG. 2C shows, the block masks BM1, BM2 and BM3, having the edge patterns 104 of both patterns PA and PB and the space 100 there between, are extracted. The hatched patterns of these block masks correspond to the openings of the edge patterns 104. The block mask BM2 is the same as an ordinary line and space pattern, and if the width We of the edge pattern is set to be the same as the space width Ws, then this pattern is the same as a 1:1 line and space pattern. By setting the width W2 of the block mask BM2 to be a predetermined width, the block mask BM2 can be used for many narrow spaces, and the universality as a block mask can be increased. The block masks BM1 and BM3 have L shaped edge patterns 104, and can be used to expose both edges of the narrow space 100 respectively. As a result, three types of block masks, BM1, BM2 and BM3, shown in FIG. 2D, are extracted.

As described above, according to the exposure method of the present embodiment, (1) the narrow space 100 sandwiched by two large patterns is extracted from the exposure data having an exposure pattern, and (2) the block masks BM1-BM3, that include the narrow space 100 and the edge patterns 104 on both sides, are corresponded to the extracted narrow space 100, and the data to expose by the block masks BM1-BM3 and the data to expose by an ordinary variable rectangular beam and beam through another block masks are generated. And according to the exposure data generated in this way, the narrow space area is exposed by the beam which passes through the block masks BM1-BM3, and the other area is exposed by the ordinary variable rectangular beam and beam through another block mask.

Figure 3:
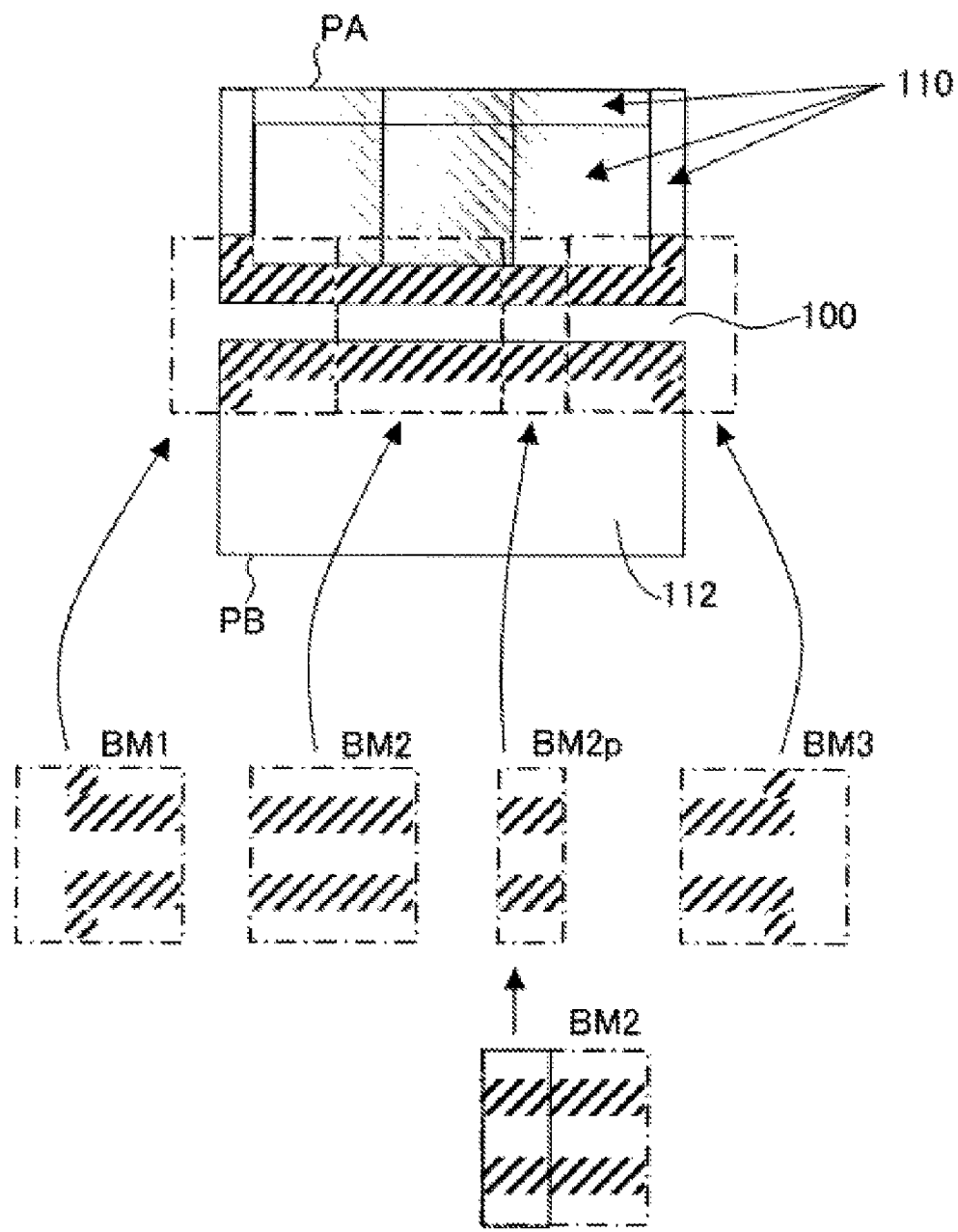
FIG. 3 is a diagram depicting the electron beam exposure method according to the present embodiment.

FIG. 3 is a diagram depicting the electron beam exposure method according to the present embodiment. As FIG. 2 shows, according to the exposure data separated into areas where the block masks BM1-BM3 are used and the area where an ordinary exposure method is used, exposure is executed as shown in FIG. 3. In other words, in the area 110, which is not facing the narrow space 100, of the large pattern PA, the plurality of divided rectangular patterns are written by the rectangular beam through the variable rectangular mask, or a rectangular beam through a predetermined block mask. The area 112, which is not facing the narrow space 100, of the large pattern PB, is also exposed by the same method. The areas, which are facing the narrow space 100 between the large patterns PA and PB, on the other hand, are exposed using the block masks BM1, BM2 and BM3. In other words, the left edge of the narrow space 100 is exposed by the beam which passes through the block mask BM1, the center portion is exposed by the beam which passes through the block mask BM2, and the beam which passes through a part of the block mask BM2p, and the right edge is exposed by the beam which passes through the block mask BM3. If the width of the large patterns (horizontal direction) is long, the block mask BM2 is repeatedly used for exposure.

In this way, the narrow space area sandwiched by the large patterns is exposed using the block masks BM1, BM2 and BM3, so that the accuracy margin of the space width can be increased in terms of the following points. First, the edge patterns on both sides of the narrow space 100 do not shift, since block masks are used. Secondly, even if the boundary of the exposure fields comes to the position of the narrow space 100, the influence of an alignment error between the exposure fields is not received, since block masks are used. And thirdly, the problem of beam blurring, due to the Coulomb interaction when the large sized variable rectangular beam is irradiated, can be solved, since a block mask having the relatively narrow width edge pattern and the narrow space are used.

Figure 4:
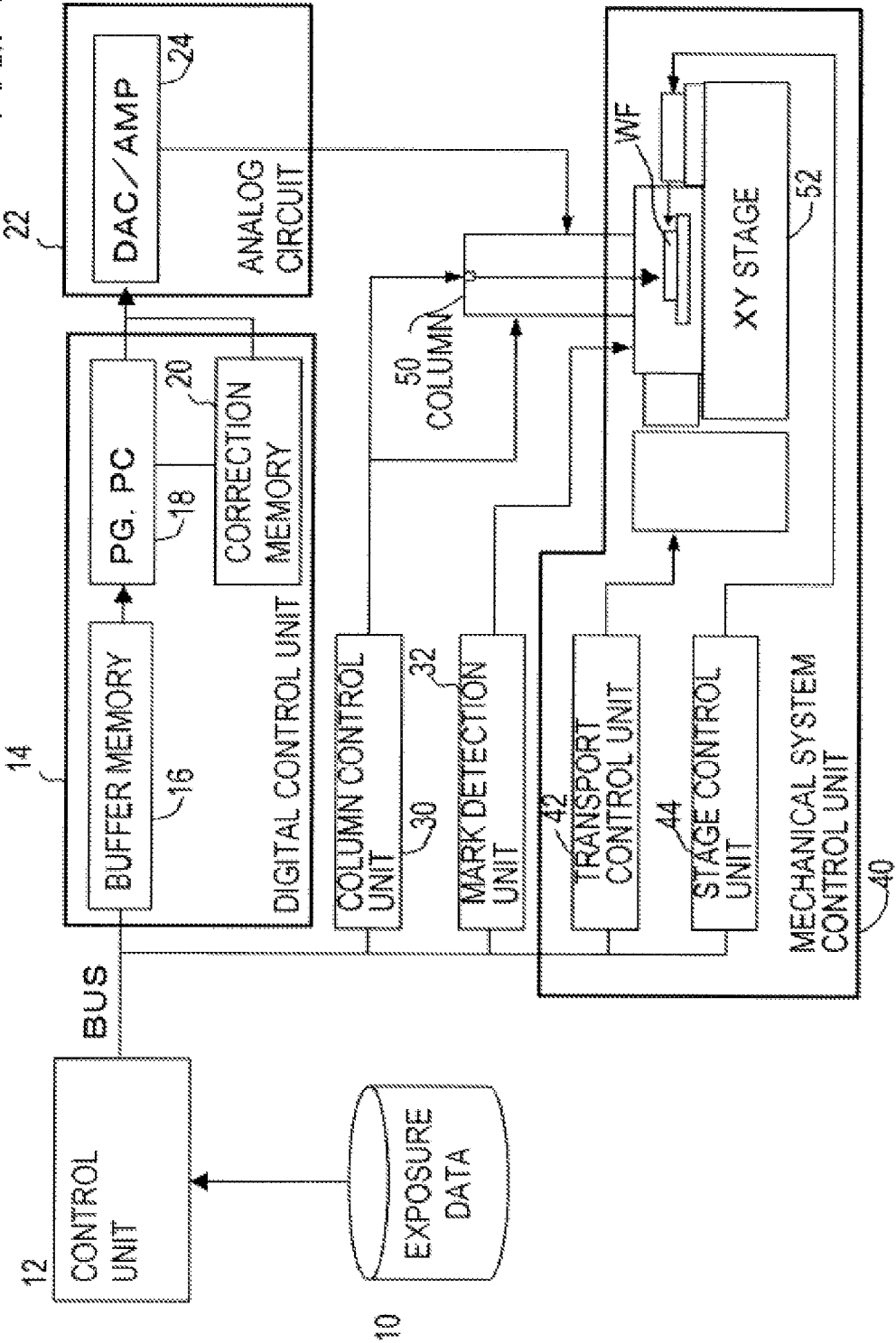
FIG. 4 is a block diagram depicting the electron beam exposure device according to the present embodiment.

FIG. 4 is a block diagram depicting the electron beam exposure device according to the present invention. A digital control unit 14, column control unit 30, mark detection unit 32, and mechanical system control unit 40 are connected to the control unit 12 constituted by a workstation via the bus BUS. In the control unit 12, the exposure data 10 is provided and electron beam exposure is executed based on this exposure data. Therefore this exposure data 10 has a data configuration for the narrow space sandwiched by the large patterns to be exposed using block masks. The digital control unit 14 is comprised of a buffer memory 16 for temporarily storing the exposure data from the control unit 12, and pattern generator and pattern correction unit 18 for generating an exposure pattern for the exposure device from the exposure data and correcting the exposure pattern by referring to the correction memory 20. The analog circuit 22 is comprised of the D/A conversion and amplification circuit 24 for converting digital command signals from the pattern generator and pattern correction unit 18 into analog signals and amplifying them. By this circuit 24, the transmission mask in the column is controlled. The column control unit 30 controls the electron gun and lens system in the column 50. The mark detection unit 32 detects the alignment marks formed on the wafer WF in the column or on the stage. And the mechanical system control unit 40 comprises a transport control unit 42 for controlling the transport of the wafer WF to be exposed into and out of the exposure device, and a stage control unit 44 for controlling the movement of the stage on which the wafer WF is mounted.

Figure 5:
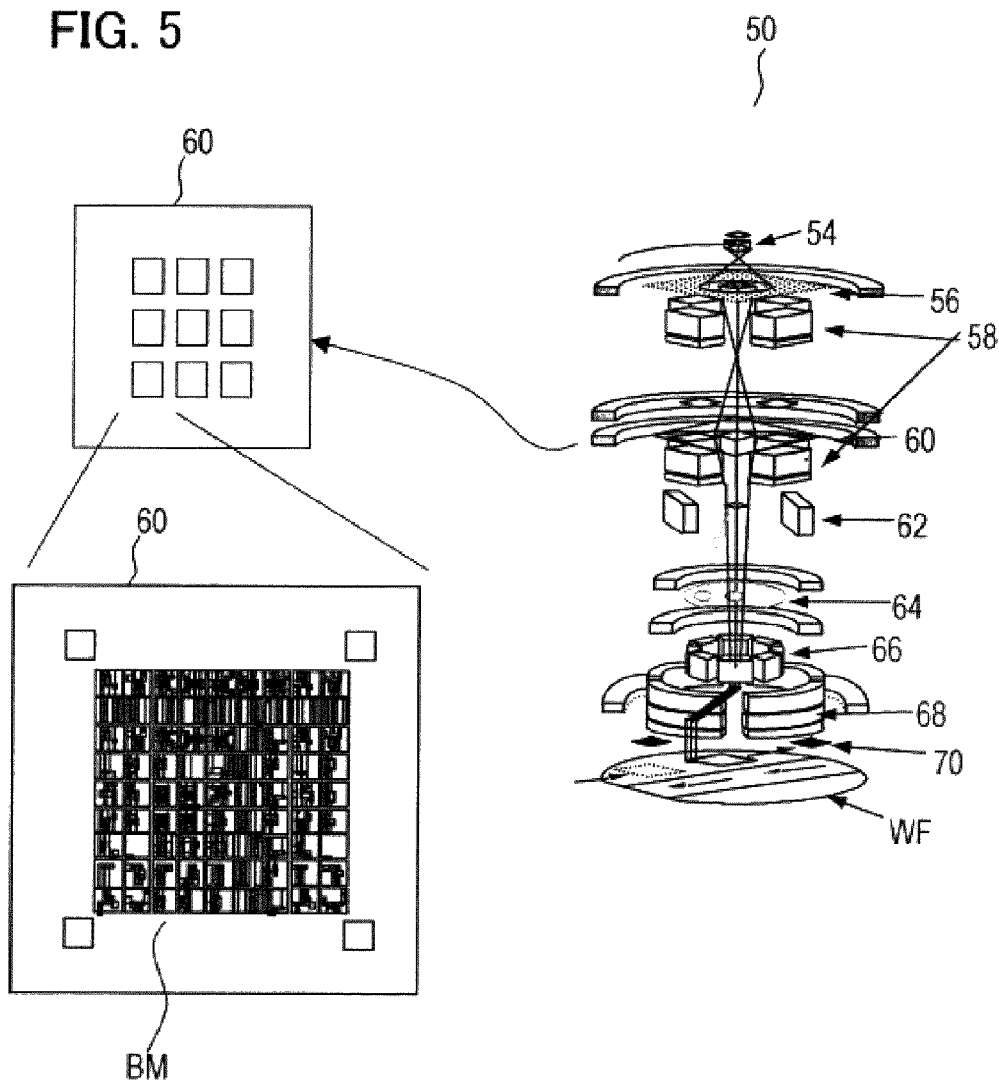
FIG. 5 is a diagram depicting the configuration inside the column of the electron beam exposure device according to the present embodiment.

FIG. 5 is a diagram depicting the configuration of the electron beam exposure device in the column according to the present embodiment. In the column 50, an electron gun 54 for generating the electron beam, a first slit 56 having a rectangular opening for shaping the electron beam generated by the electron gun 54 into a rectangular beam, a deflector 58 for deflecting the electron beam, a block mask 60 for passing the rectangular beam shaped by the first slit, through, blanking 62, aperture 64, secondary deflector 66 comprising an electrostatic deflection unit, a primary deflector 68 comprising an electromagnetic deflector, and a reflecting electron detector 70 for detecting marks, are disposed. And the block mask 60 further comprises a plurality of masks where a special pattern to be repeatedly drawn is opened, as shown by the enlarged views, and an electron beam having the opening pattern of the block mask can be generated by passing the rectangular beam through the selected block mask. These plurality of block masks include not only the block masks BM1-BM3 shown in FIG. 2, but also a mask having a rectangular opening pattern for a variable rectangular beam. By passing the rectangular beam through the mask for a variable rectangular beam via the block mask 60, a rectangular beam having a desired size can be generated.

Figure 7A:
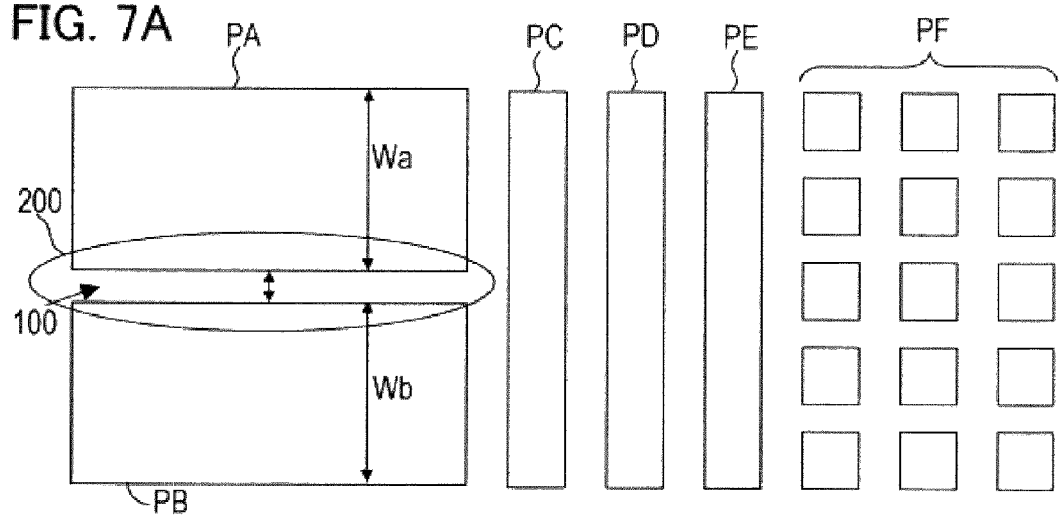
FIG. 7 are diagrams depicting an example of the pattern to be the target of exposure data generation.

FIG. 6 is a flow chart depicting the exposure data generation method according to the present embodiment, FIG. 7 are drawings depicting an example of a pattern to be the target of exposure data generation. The exposure data generation method in FIG. 6 corresponds to the procedure by the exposure data generation program to be executed by a computer, which is not illustrated. First, as shown in the flow chart in FIG. 6, the narrow space between the large patterns, which the present embodiment targets, is detected from the design data 80 including the pattern shown in FIG. 7. In the case of FIG. 7A, the area 200 sandwiched by the large patterns PA and PB, having pattern widths Wa and Wb which are larger than a predetermined size, is detected (S10). The patterns PC, PD, PE on the write line and rectangular pattern PF in a matrix do not belong to the category of patterns larger than the predetermined size, and the spaces sandwiched thereby are not extracted.

Figure 7B:
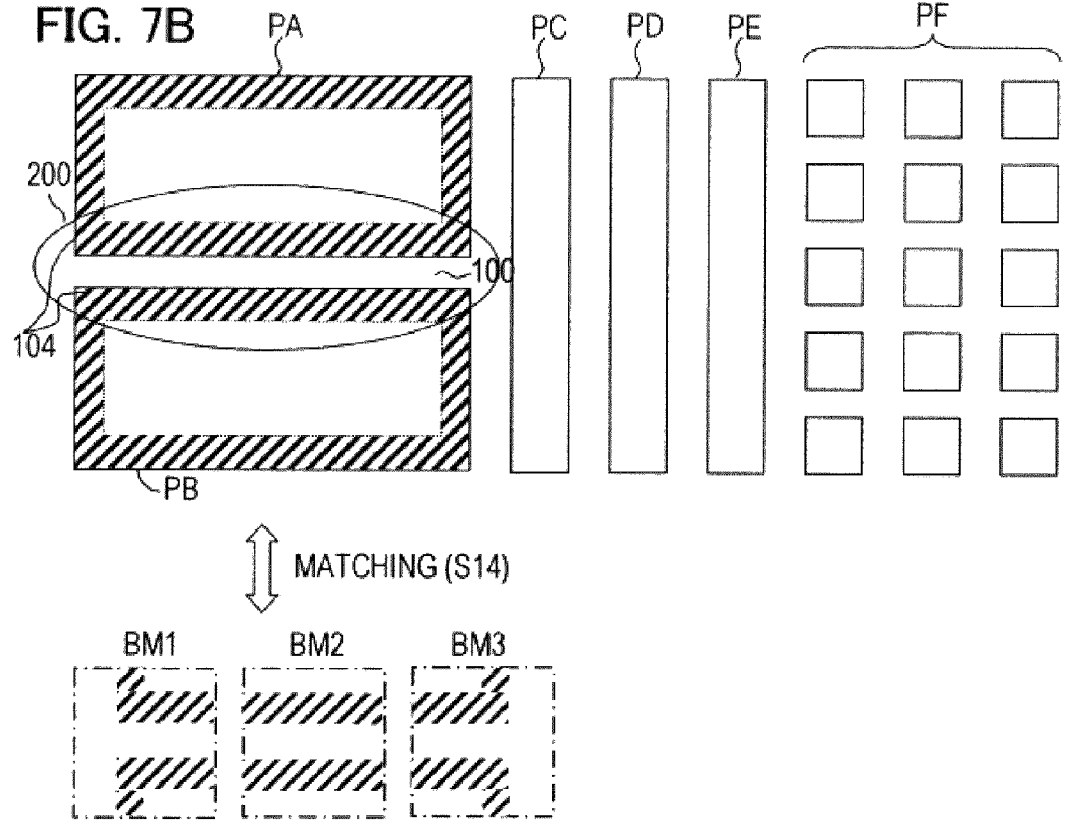

Then as FIG. 7B shows, the edge patterns 104 (hatched area in FIG. 7B) of the detected large patterns PA and PB are extracted (S12). As FIG. 2 shows, this edge pattern 104 has a predetermined pattern width We. And the edge patterns 104 and the narrow space 100 there between are matched with the pattern of the block masks BM1-BM3, which have been generated in advance, and the area that can be exposed by the block masks BM1-BM3 is extracted (S14). And finally, the matched exposure areas for the block masks are removed from the large patterns PA and PB (S16), and ordinary exposure data 104, including the exposure data using the variable rectangular beam or beam through a predetermined block mask, and exposure data 10B by the block masks BM1-BM3, are separately generated. The patterns PC, PD, PE and PF, of which sizes are smaller than the predetermined size, are included in the ordinary exposure data for exposing by the mask for the variable rectangular beam, not exposing by the block masks BM1-BM3.

By the above processing, the exposure data, to expose the narrow space area sandwiched by the large patterns PA and PB using the block masks BM1-BM3, is generated. Each block mask BM1-BM3 is comprised of the narrow space and edge patterns with predetermined width We sandwiching the narrow space, so they can be universally used without depending on the size of the large patterns PA and PB. To change the width of the block masks BM2, a part of the area of the block mask BM2 is used, as shown in FIG. 3, therefore block mask BM 2 can be used with any width.

FIG. 8 is a flow chart depicting the electron (charged particle) beam exposure method according to the present embodiment. The exposure data comprised of the ordinary exposure data 10A and the block mask exposure data 10B generated by the above mentioned exposure data generation method are input to the control unit 12 (S20). And the control unit 12 sets the exposure field, and moves the X and Y stages so that the exposure field of the wafer comes to the center of the column (S22). This exposure field corresponds to the main sub-field area that can be deflected by the primary deflector. And the control unit 12 sequentially processes data included in the exposure data, and if the exposure data to be exposed with the block mask is detected (S24), the control unit 12 executes exposure using the specified block mask (S26), and executes exposure with the variable rectangular beam in other cases (S28). The exposure by the block mask includes the exposure by the block masks BM1-BM3 for exposing the narrow space area, and may also include exposure using other block masks. In this way, exposure by a block mask and exposure by the variable rectangular beam are repeated until exposure of the exposure field that was set completes (S30). When the exposure of all the exposure fields in the wafer ends (S32), the electron beam exposure processing ends.

According to the above exposure method, the narrow space 100 sandwiched by the large patterns PA and PB is exposed by the block masks BM1-BM3 which are comprised of the edge patterns of the large patterns and spaces, as described in FIG. 3. An area other than the narrow space is exposed using a variable rectangular beam or a block mask other than the block masks BM1-BM3. Therefore such problems as displacement when the large patterns are exposed by a variable rectangular beam, displacement due to an exposure field boundary, and beam blurring are solved, and process dispersion with respect to the size of the narrow space 100 can be suppressed or avoided. The block mask for generating the narrow space has a pattern similar to lines and spaces, and has a universality that does not depend on the size of the large patterns, so the number of block masks need not be increased unnecessarily.

FIG. 9 are diagrams depicting the correction of the block masks according to the present embodiment. Although the edge patterns on both sides sandwiching the narrow space are simultaneously exposed using the block masks, the exposure to form the large patterns is executed in the peripheral area. Because of this, in the narrow space area, exposure energy by backward scattering caused by the proximity effect is added, and the pattern size to be developed tends to be larger. So according to the size of the large patterns sandwiching the narrow space and the narrow space width, the space width of the block masks are corrected.

In FIG. 9, when the space width is 0.1-0.5 µm, the space width of the block masks are corrected to be 0.15 µm (W1), 0.12 µm (W2) and 0.10 µm (W3) corresponding to the pattern size 1.0 µm or more, about 0.5 µm and 0.2 µm or less of the large patterns in the horizontal direction in the table. In this way, if the space width is corrected so as to increase as the size of the large patterns increase, decreasing the space width due to the proximity effect and shorting of the large patterns, can be suppressed. If the space width exceeds 0.5 µm, the space width of the block mask is the same as the design value. The space width is corrected by selecting one of the three types of block masks, B1, B2 and B3, which are provided in advance, as shown in FIG. 9. The block mask B1 has a space width the same as the design value, and block mask B2, on the other hand, has a space width W2 which is wider. The space width W3 of the block mask B3 is even wider. The edge pattern width of the block masks B1, B2 and B3 differ depending on the space widths W1, W2 and W3.

As FIG. 9 shows, the number of block mask types must be increased to correct the space width of a block mask. However, for the large patterns of which the pattern size exceeds 1.0 µm, large patterns of which the patterns size is 1.0-0.2 µm and patterns of which the pattern size is smaller than 0.2 µm, the common block masks B1, B2 and B3 can be used, so in this range, a block mask can have universality.

The block mask shown in FIG. 9 can be selected according to the following methods. According to the first method, in the step for generating the exposure data from the design data in FIG. 6, the narrow space width Ws between the extracted edges is corrected based on the correction table according to the large pattern size of the design data in step 14, and the extracted edge pattern having the corrected narrow space width is matched with the block masks having a plurality of different space widths, and an optimum block mask is selected. According to the second method, in the step of generating the exposure data from the design data in FIG. 6, a block mask is selected by matching in step 14, and if the corresponding large pattern size of the selected block mask is larger than a predetermined size, the selected block mask is replaced with a corrected block mask with a larger narrow space width based on the correction table in FIG. 9. According to the third method, the data of the corresponding large pattern size is added to the block mask data of the exposure data as attribute data. And in the exposure device to which this exposure data is supplied, a corrected block mask is selected based on the correction table according to the large pattern size of the attribute data, and exposure is executed.

By any of the above methods, an optimum block mask, corrected according to the size of the large patterns having a narrow space to be exposed by the block mask, can be selected.

What is claimed is:

1. An exposure data generation method for generating exposure data from design data including a plurality of patterns, comprising:
   detecting a narrow space area sandwiched by a pair of large patterns having a predetermined size or more among said plurality of patterns;
   extracting edge patterns having a predetermined width from the pair of large patterns sandwiching said detected narrow space; and
   generating, using a computer, first exposure data for exposing said narrow space area using a first block mask having said narrow space and edge patterns on both sides thereof, and second exposure data for exposing said pair of large patterns other than said narrow space area using a second block mask that is different from said first block mask, or a mask for a variable rectangular beam.

2. The exposure data generation method according to claim 1, wherein said generation step includes matching said narrow space of said narrow space area and the edge patterns on both sides thereof with a pre-generated pattern of the first block mask having a narrow space and stripe pattern on both sides thereof, and generating the first exposure data for exposing the matched narrow space area using said matched first block mask.

3. The exposure data generation method according to claim 1, wherein said generation step includes generating said first exposure data for exposing said narrow space area sandwiched by said pair of large patterns by irradiating a charged particle beam using said first block mask repeatedly.

4. The exposure data generation method according to claim 1, wherein said first block mask includes at least block masks corresponding to both edges of said narrow space area and a block mask corresponding to an area other than both edges of said narrow space area.

5. The exposure data generation method according to claim 1, wherein said first block mask further includes a plurality of sets of block masks, that are different in such a way that the narrow space width of said block mask becomes wider as the size of said pair of large patterns increases, and an optimum block mask is selected from said plurality of sets of block masks according to the size of said large patterns.

6. The exposure data generation method according to claim 1, wherein an exposure target area is divided into a plurality of exposure fields, and said first exposure data includes data for exposing said narrow space area using said first block mask even if said narrow space coincides with the boundary of said exposure fields.

7. The exposure data generation method according to claim 1, wherein said second exposure data includes data for exposing a narrow space area sandwiched by a pair of large patterns having a size less than said predetermined size without using said first block mask.

* * * * *